US007031169B2

(12) United States Patent
Schlueter et al.

(10) Patent No.: US 7,031,169 B2
(45) Date of Patent: Apr. 18, 2006

(54) MODULAR DEVICE

(75) Inventors: Malte Schlueter, Leinfelden-Echterdingen (DE); Jens Heitkamp, Gaeufelden (DE)

(73) Assignee: Agilent Technologies, Inc., Palo Alto, CA (US)

( * ) Notice: Subject to any disclaimer, the term of this patent is extended or adjusted under 35 U.S.C. 154(b) by 289 days.

(21) Appl. No.: 10/442,217

(22) Filed: May 20, 2003

(65) Prior Publication Data

US 2004/0075992 A1 Apr. 22, 2004

(30) Foreign Application Priority Data

Oct. 18, 2002 (EP) ................................ 02023374

(51) Int. Cl.
*H05K 7/14* (2006.01)
*H05K 7/18* (2006.01)

(52) U.S. Cl. ...................... 361/800; 361/756; 361/725

(58) Field of Classification Search ................ 361/800, 361/797, 686, 788, 752, 741, 801–802, 756, 361/755, 725
See application file for complete search history.

(56) References Cited

U.S. PATENT DOCUMENTS 4,914,552 A * 4/1990 Kecmer ...................... 361/801
5,721,669 A 2/1998 Becker et al. ............. 361/685

FOREIGN PATENT DOCUMENTS

DE 2014487 10/1971
GB 2305300 4/1997

* cited by examiner

*Primary Examiner*—Randy W. Gibson
*Assistant Examiner*—Hung S. Bui

(57) ABSTRACT

A modular device with a housing includes at least one slot adapted for receiving an insert module and including a housing connector, each insert module includes a module connector for providing a connection with the housing connector, a driving device drives at least one of: the insertion and removal of the insert module into and out of the respective slot and includes two driving members and an actuator cooperating with one of the driving members for providing a displacement between the two driving members parallel to the plugging direction of the connectors, one of the driving members is mounted at the housing, while the other is mounted at the insert module, the actuator and one of the driving members are mounted at the housing or at the insert module, and the two driving members of the driving device are a projection extending perpendicularly to the plugging direction of the connectors.

24 Claims, 2 Drawing Sheets

MODULAR DEVICE

BACKGROUND OF THE INVENTION

The present invention relates to modular devices, preferably to modular measurement devices.

A gear-driven docking apparatus for removable mass-storage drives is known from U.S. Pat. No. 5,721,669.

SUMMARY OF THE INVENTION

It is an object of the present invention to provide an improved modular device. The object is solved by the independent claim. Preferred embodiments are shown by the dependent claims.

According to the present invention, a modular device, preferably a modular measurement device, comprises a housing and at least one insert module. The housing comprises at least one slot for inserting such an insert module, and the insert module comprises e.g. measurement electronics, devices and equipment. Different insert modules may comprise different measurement electronics, devices and equipment. Therefore it is possible to provide the housing with various combinations of insert modules with the intention of optimally adapting the measurement device to the specific measurement job to perform.

To this end each insert module comprises a module connector, preferably an electronic module connector, and the housing comprises in each slot a housing connector, preferably an electronic housing connector. The housing connector is adapted to provide a connection with the module connector when coupled thereto. To this aim the housing connector preferably is complementarily designed to the module connector. Each pair of housing connector and module connector is preferably adapted for providing a plug-and-socket connection, when the respective insert module becomes inserted into the respective slot. Usually the insert direction between the housing and the insert module extends substantially parallel to the plugging direction between the housing connector and the module connector.

Electronic plug-and-socket connectors normally have several male members (pins) and corresponding female members (pin receptacles), wherein each pair of male and female members provide a plug-and-socket connection. The performing of the plugging in of all male members into the respective female members requires a certain plugging force. In the same way, the pulling off of all male members out of the female members requires a certain pulling force. The values of the plugging force and of the pulling force depend on the number of male and female members to be connected or disconnected, respectively. The more male and female members the higher the necessary forces. Since the measurement equipment of the insert modules gets more and more elaborate, the number of necessary male and female members increases. Therefore, the inserting and removing of the insert modules becomes more and more difficult.

By providing each pair of slot and insert module with a driving device provided for driving or powering the plugging in and/or the pulling off of the insert module or the plug-and-socket connectors, respectively, the inserting and/or the removing of the insert modules is very simple to perform, even though the plug-and-socket connectors have a large number of male and female members. Therefore, the handling of the measurement device is improved or simplified.

According to a preferred embodiment the driving device comprises two driving members, preferably a projection extending perpendicularly to the plugging direction of the connectors, and a reception provided for receiving the projection, when the insert module becomes inserted into the respective slot. The driving device also comprises an actuator cooperating with one of the driving members for providing a displacement between the driving members parallel to the plugging direction of the connectors. One of the driving members is mounted at the housing, while the other is mounted at the insert module. One of the driving members is fixedly mounted, while the other is displaceably mounted. The actuator and the displaceable driving member are mounted at the housing or at the insert module, respectively. This embodiment distinguishes itself by a simple, reliable and low cost design providing the necessary plugging and/or pulling forces.

According to a further improved embodiment the actuator comprises a roll rotatably mounted with respect to a rotation axle extending parallel to the plugging direction of the connectors, wherein the displaceable driving member is formed as a screw shaped winding provided at the jacket of the roll and extending coaxially to the rotation axle, and wherein the actuator is adapted for providing a rotation of the roll around its rotation axle. This features provide a transformation of an input rotating movement into an output linear movement, and lead to a compact design, which enables to provide comparatively high forces by means of comparatively small torques.

The achieved transformation of a rotation into a longitudinal movement, or of a torque into a longitudinal force, respectively, depends on the pitch of the winding. Since the roll is directly driven by a manually operated actuating member, an easy handling can be reached, when the winding of the roll is adapted to be turned in a range less than 360°, and preferably about 270°, around the rotation axle in order to provide the driving of the driving device.

In a further embodiment a pitch of the winding is chosen such that the maximal turn of the winding provides a displacement parallel to the rotation axle between the two driving members, which displacement has a displacement length, which is as big as or bigger as a plugging length of a plug-and-socket connection provided by the connectors. Said plugging length provides a save connection, in particular a save electric connection, between the connectors. This features provide an easy handling, since the respective insert module is completely inserted, when the roll reaches the maximal turn of the winding. Therefore, a correct installation of the insert module within the housing is further simplified.

BRIEF DESCRIPTION OF THE DRAWINGS

Other objects and many of the attendant advantages of the present invention will be readily appreciated and become better understood by reference to the following detailed description when considered in connection with the accompanying drawings. Features that are substantially or functionally equal or similar will be referred to with the same reference sign(s).

DETAILED DESCRIPTION OF THE INVENTION

Figure 1:
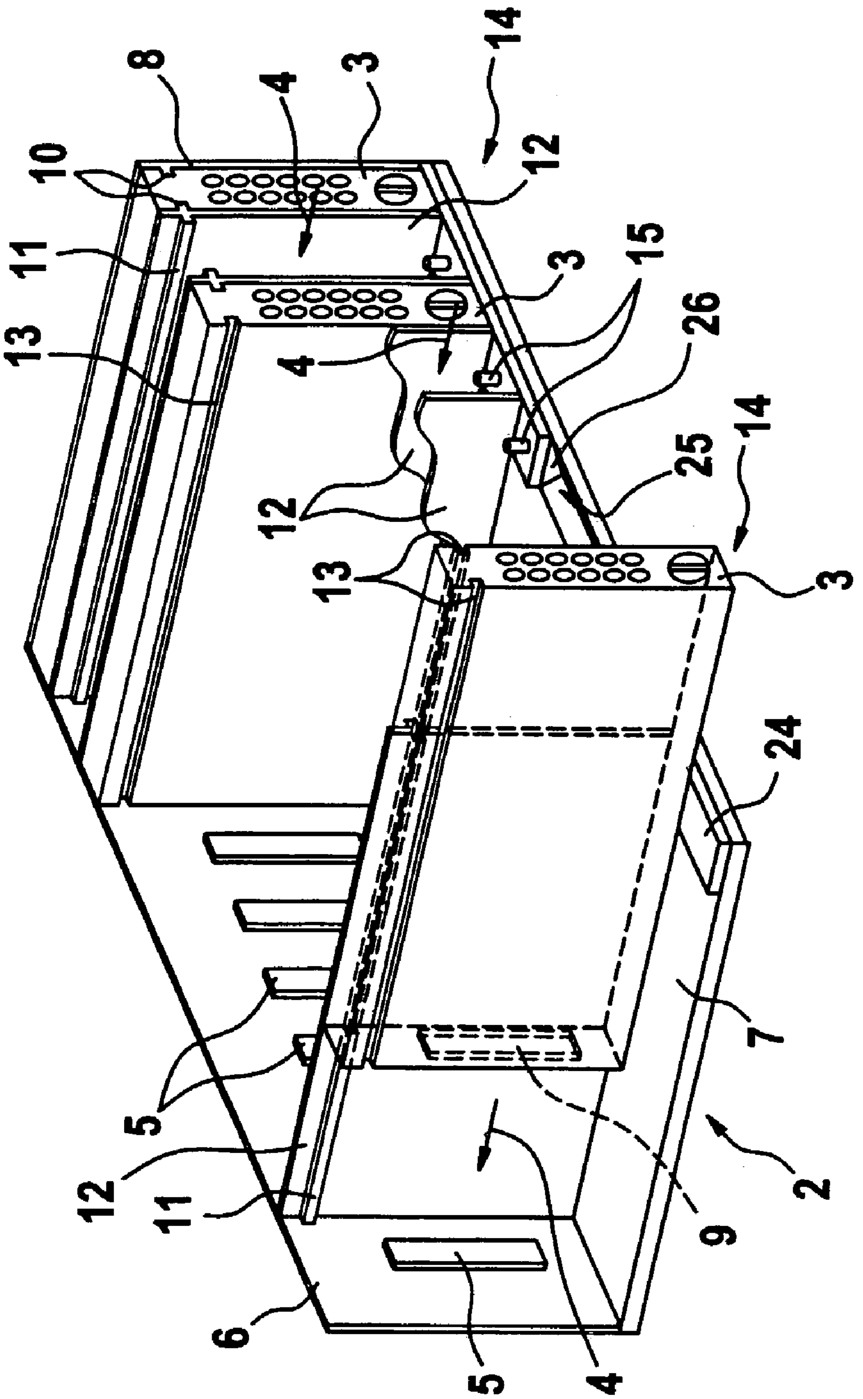
FIG. 1 depicts a perspective view of a measurement device according to the invention.

According to FIG. 1 a modular designed measurement device 1 comprises a housing 2 and one or more insert modules 3 assembled within the housing 2. The housing 2 comprises an open front side turned to the viewer, a rear wall 6, a bottom 7, a cover not shown, a left side wall not shown and a right side wall 8. Each insert module 3 contains not shown measurement electronics, equipment and/or devices, wherein different types of insert modules 3 are provided for different measurement tasks and therefore contain different equipment suitable for the respective measurement task. In order to adapt the measurement device 1 for a specific measurement job, the housing 2 can be equipped with the applicative insert modules 3.

To this aim the housing 2 comprises several slots 4, each adapted for receiving one of the insert modules 3. Within each slot 4 the housing 2 is provided with an electric housing connector 5 arranged at the rear wall 6. Each insert module 3 is provided with an electric module connector 9, which is complementarily designed to the housing connectors 5 and which is arranged at a rear end of the insert module 3. Said rear end of the insert module 3 is turned to the rear wall 6 during insertion of the insert module 3. The housing connectors 5 and the module connectors 9 are adapted for providing a plug-and-socket connection 5, 9, when the insert module 3 is inserted into the respective slot 4.

To simplify a correct insertion of the insert modules 3 into the respective slot 4, the housing 2 and the respective insert module 3 are provided with a guidance 10. This guidance 10 is provided for guiding and aligning the respective insert module 3 parallel to the plugging direction of the plug-and-socket connection 5, 9, and therefore, the guidance 10 defines an insert direction parallel to this plugging direction. The guidance 10 preferably comprises first members assigned to the housing 2 and co-operating with second members assigned to the respective insert module 3. The first members may be arranged at the bottom 7 and/or at a ceiling not shown of the housing 2. In the depicted embodiment each guidance 10 comprises two rails 11 extending parallel to said insert direction. Said rails 11 are assigned to the housing 2 and therefore provide the first members of the guidance 10. The rails 11 are facing each other in every slot 4 and are arranged at opposing sides of walls, namely the right side wall 8, the not shown left side wall and inside walls 12 arranged between the left and right side walls. Each insert module 3 is provided with two grooves 13 extending parallel to the insert direction. Said grooves 13 are assigned to the respective insert module 3 and therefore provide the second members of the guidance 10. During insertion of the insert module 3 the two rails 11 of the respective slot 4 project into the two grooves 13 of the insert module 3. Thus, this co-operation of rails 11 and grooves 13 provides the desired guiding and aligning of the respective insert module 3.

In the depicted embodiment the inside walls 12 extend from the bottom 7 to the cover not shown. In another embodiment the inside walls may be shorter and only attached to the cover or to the bottom 7.

Figure 2:
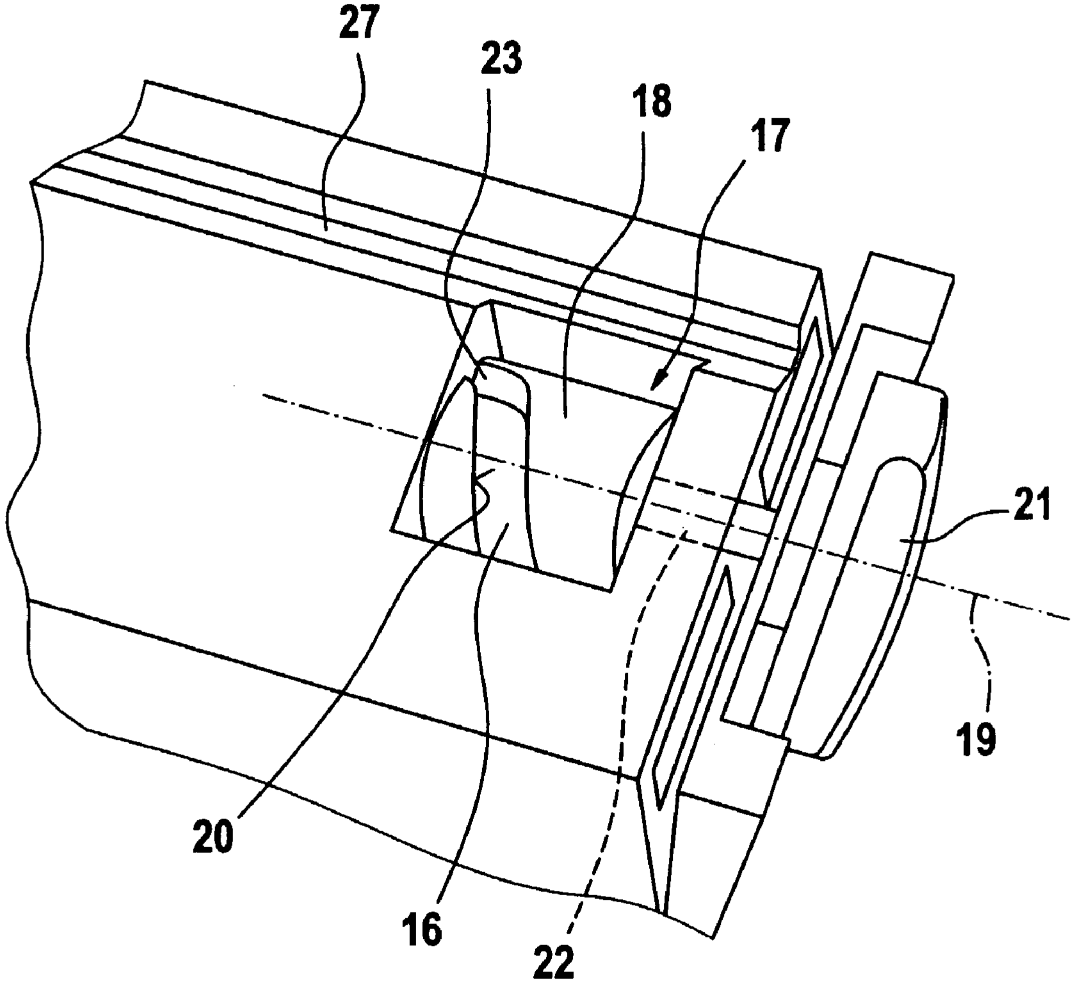
FIG. 2 depicts an enlarged view of a detail of an insert module of the measurement device.

According to the present invention each pair of slot 4 and insert module 3 is provided with a driving device indicated in the FIGS. 1 and 2 with 14. Each driving device 14 is adapted for facilitating and powering the insertion of the respective insert module 3 into the respective slot 4 and/or the removing of the insert module 3 out of the slot 4.

In the depicted preferred embodiment each driving device 14 comprises a projection 15 (see FIG. 1) and a reception 16 (see FIG. 2). The projection 15 extends perpendicularly to the insert or plugging direction and is here formed as a pin and arranged at the housing 2, in particular at a bar 24. This bar 24 extends at the bottom 7 transverse to the plugging or insert direction from the left side wall to the right side wall 8. The bar 24 supports the projections 15 of all driving devices 14. In the shown embodiment the bar 24 and therefore the projections 15 are arranged at or nearby the open front side of the housing 2. The projections 15 are fixedly mounted.

The receptions 16 are provided at the insert modules 3, wherein each insert module 3 comprises its own reception 16. The reception 16 according to FIG. 2 is displaceable mounted at the respective insert module 3, wherein the provided displacement direction extends parallel to the desired insert or plugging direction. To perform the displacement of the reception 16 relative to the projection 15 the driving device 14 comprises an actuator 17. Since the projection 15 in this embodiment is fixedly mounted at the housing 2, the actuator 17 is adapted for providing a movement between the reception 16 and the respective insert module 3. By inserting one of the insert modules 3 into one of the slots 4 the respective projection 15 intrudes into the respective reception 16. As the projection 15 projects into the reception 16 the actuator 17 can perform the displacement between the reception 16 and the insert module 3. According to the form locking connection between projection 15 and reception 16 this displacement generates the desired movement between the insert module 3 and the housing 2.

In the depicted embodiment the actuator 17 comprises a roll 18, which is arranged at the bottom of the insert module 3 and is rotatably mounted within the insert module 3 such that a rotation axle 19 of the roll 18 extends parallel to the plugging and inserting direction. The roll 18 comprises a screw shaped winding 20 extending coaxially to the rotation axle 19 and provided at the jacket of the roll 18. This winding 20 provides the displaceable driving member of the driving device 14. In the present example, the winding 20 forms the reception 16. In another embodiment, the winding may form the projection.

During insertion of the insert module 3 into the housing 2, the projection 15 intrudes into the reception-winding 16, 20. To simplify the introduction of the projection 15 into the reception 16, the reception 16 or the winding 20, respectively, comprises at a side turned to the module connector 9 an end portion 23 adapted in a suitable manner. Said end portion 23 preferably extends axially and has an axially open end providing an axial entrance for the projection 15. Another feature for improving the introduction of the projection 1 into the reception 16 is achieved by providing the housing 2 and the insert module 3 with an alignment device 25, of which only one is exemplarily depicted in FIG. 1. The said alignment device 25 is adapted for helping the projection 15 to find into the reception 16, when the insert module 3 becomes inserted into the respective slot 4. In the preferred embodiment each alignment device 25 comprises a V-channel 26 (see FIG. 1) and an alignment rail 27 (see FIG. 2). On the one hand the alignment rail 27 is provided at the insert module 3 at its bottom and extends into the plugging direction of the module connector 9. On the other hand the V-channel 26 tapers in the insert direction and is arranged at the housing 2 within the respective slot 4. In this example the bar 24 is provided with the V-channels 26 of all slots 4. The V-channel 26 shows a wide end turned away from the housing connector 5 and a narrow end turned to the housing connector 5. At the beginning of the insertion of the insert module 3 into the respective slot 4, the alignment rail 27 finds the wide end of the V-channel 26 and intrudes into the V-channel 26. With the proceeding insertion movement the tapering V-channel 26 centers the alignment rail 27 into the narrow end of the V-channel 26 and thus aligns the alignment rail 27 into the desired inserting direction.

In order to perform the linear displacement of the reception 16, the actuator 17 is adapted to provide a rotation of its roll 18. This rotation urges the projection 15 along the winding 20 and along the jacket of the roll 18. Therefore, the rotation generates a displacement between the projection 15 and the reception 16 parallel to the rotational axle 19. In the end the said displacement drives the insert module 3 into the slot 4 for connecting the plug-and-socket connection 5, 9 or the said displacement drives the insert module 3 out of the slot 4 for disconnecting the plug-and-socket connection 5, 9, respectively.

According to FIG. 2 the actuator 17 also comprises an actuating member 21 drive coupled with the roll 18. This actuating member 21 is adapted for generating a rotational movement of the roll 18 by inserting an appropriate torque into the roll 18 around its rotational axle 19. In the shown example the actuating member 21 is directly coupled with the roll 18 by means of a common shaft 22. In another embodiment the actuating member 21 can be indirectly coupled with the roll 18 by means of a reduction gear in order to reduce the torque at the actuating member 21.

The actuating member 21 as shown is arranged at the front side of the insert module 3 and is adapted for manually inserting the torque into the actuating member 21. In another embodiment the actuating member additionally or alternatively may be adapted for a form locking coupling with a tool provided for inserting the torque into the actuating member 21.

According to the depicted embodiment the winding 20 turns not more than 360° around the rotation axle 19, preferably the winding 20 turns about 270° around the rotation axle 19. Favorably a pitch of the winding 20 is chosen such that the maximal turn of the winding 20 provides a predetermined displacement parallel to the rotation axle 19 between the reception 16 and the inserted projection 15. This displacement has a predetermined displacement length, which is as big as or bigger as a necessary plugging length of the plug-and-socket connection 5, 9. This necessary plugging length is chosen such that usually a save electric connection between the connectors 5, 9 can be established.

In the depicted preferred embodiment the driving devices 14 provide a two-phase insertion and a two-phase removing of the insert modules 3. In the first phase of the insertion the driving members 15, 16 of the respective driving device 14 can not co-operate and therefore the insert module 3 can be manually inserted until the connectors 5, 9 face each other vis-à-vis. At the end of the first phase the projection 15 extends into the reception 16. In the following second phase the driving members 15, 16 co-operate and a suitable activating of the actuating member 21 provides a powered movement until the connectors 5, 9 are properly connected.

In the first phase of the removing an adequate activating of the actuating member 21 provides a powered movement until the connectors 5, 9 are just disconnected. In the following second phase the driving members 15, 16 again do not co-operate and therefore the insert module 3 can be manually removed out of the respective slot 4.

What is claimed is:

1. Modular device with a housing comprising at least one, slot, wherein:
- each slot is adapted for receiving an insert module and comprises a housing connector,
- each insert module comprises a module connector adapted to provide a connection with the housing connector when coupled thereto,
- a driving device is provided for each pair of slot and corresponding insert module,
- the driving device is provided for driving at least one of: the insertion of the insert module into the respective slot, and the removing of the insert module out of the respective slot,
- the driving device comprises two driving members,
- the driving device also comprises an actuator cooperating with one of the driving members for providing a displacement between the two driving members parallel to the plugging direction of the connectors,
- one of the driving members is mounted at the housing, while the other is mounted at the insert module,
- the actuator and one of the driving members are mounted at the housing or at the insert module, respectively,
- the two driving members of the driving device are a projection extending perpendicularly to the plugging direction of the connectors, and a reception provided for receiving the projection, when the insert module becomes inserted into the respective slot,
  - the actuator comprises a roll rotatably mounted with respect to a rotation axle extending parallel to the plugging direction of the connectors,
  - the displaceable driving member is formed as a screw shaped winding provided at the jacket of the roll and extending coaxially to the rotation axle, and
  - the actuator is adapted for providing a rotation of the roll around its rotation axle.

2. Device according to claim 1, wherein:
- one of the driving members is fixedly mounted, while the other is displaceably mounted, and
- the displaceable driving member is mounted at the housing or at the insert module.

3. Device according to claim 2, wherein:
- the displaceable drive member and the actuator are mounted at the insert module,
- the fixedly mounted drive member is mounted at the housing in the respective slot,
- the housing comprises a bar extending transverse to the insert direction and provided with the fixedly mounted drive members of two or more slots.

4. Device according to claim 1, wherein:
- the actuator comprises an actuating member coupled with the roll and adapted for inserting torque into the roll around its rotation axle,
- the actuating member is arranged at a front side of the housing or of the insert module, which front side is turned away from the connectors,
- the actuating member is provided for manually inserting torque into the actuating member and/or is provided for a form locking coupling with a suitable tool adapted for inserting torque into the actuating member.

5. Device according to claim 4, wherein the actuating member is coupled with the roll by means of a transmission gearing.

6. Device according to claim 3, wherein the winding is adapted to be turned in a range less than 360°, and preferably about 270°, around the rotation axle in order to provide the driving of the driving device.

7. Device according to claim 3, wherein a pitch of the winding is chosen such that the maximal turn of the winding provides a displacement parallel to the rotation axle between the two driving members, which displacement has a displacement length, which is as big as or bigger as a plugging length of a plug-and-socket connection provided by the housing connector and the module connector, which plugging length provides a save connection between the connectors.

8. Device according to claim 3, wherein:

the two driving members of the driving device are a projection extending perpendicularly to the plugging direction of the connectors, and a reception provided for receiving the projection, when the insert module becomes inserted into the respective slot, the winding forms the reception, the projection is formed by a pin extending into the reception winding.

9. Device according to claim 8, wherein the reception winding comprises at a side turned to the module connector an end portion axially extending and axially open.

10. Device according to claim 3, wherein the driving members and the actuator are arranged nearby a front side of the housing and a front side of the insert module, which front sides are turned away from the respective connectors.

11. Device according to claim 1, wherein the housing and the insert module are provided with an alignment device adapted for helping the projection to find into the reception, when the insert module becomes inserted into the respective slot.

12. Device according to claim 11, wherein:

the alignment device comprises a V-channel and an alignment rail projecting into the V-channel, the V-channel tapers in the insert direction and is arranged at the housing within the respective slot, the alignment rail extends parallel to the plugging direction of the module connector and is arranged at the respective insert module.

13. Device according to claim 12, wherein:

the displaceable drive member and the actuator are mounted at the insert module, the housing comprises a bar extending transverse to the insert direction and provided with the fix drive members of two or more driving devices and the alignment rails of two or more slots.

14. Device according to claim 1, wherein the housing and the insert module are provided with a guidance guiding and aligning the insert module parallel to the plugging direction of the connectors, when the insert module becomes inserted into the respective slot.

15. Device according to claim 14, wherein:

the guidance comprises at least one rail projecting into a groove, the groove and the rail extend parallel to the plugging direction of the connectors, the groove is provided at the insert module and the rail is provided at the housing, or vice versa.

16. Device according to claim 1, wherein the device is designed as a modular measurement device.

17. Device according to claim 1, wherein at least one of: the housing connector and the module connector is designed as an electric connector.

18. Device according to claim 1, wherein the housing connector and the module connector are designed complementarily.

19. Device according to claim 1, wherein each housing connector and each corresponding module connector provide a plug-and-socket connection, when the insert module becomes inserted into the respective slot.

20. Device according to claim 19, wherein the insert direction between the housing and each insert module is substantially parallel to the plugging direction between the housing connector and the module connector.

21. Insert module adapted for inserting into a slot of a modular device, wherein the insert module comprises a module connector adapted to provide a connection with a housing connector when coupled thereto, slot comprising said housing connector, a driving device is provided for each pair of insert module and corresponding slot, and the driving device is provided for driving at least one of: the insertion of the insert module into the respective slot, and the removing of the insert module out of the respective slot, the driving device comprises two driving members, the driving device also comprises an actuator cooperating with one of the driving members for providing a displacement between the two driving members parallel to the plugging direction of the connectors, one of the driving members is mounted at the housing, while the other is mounted at the insert module, the actuator and one of the driving members are mounted at the housing or at the insert module, respectively, and the two driving members of the driving device are a projection extending perpendicularly to the plugging direction of the connectors, and a reception provided for receiving the projection, when the insert module becomes inserted into the respective slot.

22. System comprising a modular device and at least one insert module, wherein:

the device comprises a housing comprising at least one slot, each slot is adapted for receiving one of the insert modules and comprises a housing connector, each insert module comprises a module connector adapted to provide a connection with the housing connector when coupled thereto, a driving device is provided for each pair of slot and corresponding insert module, the driving device is provided for driving at least one of: the insertion of the insert module into the respective slot, and the removing of the insert module out of the respective slot, the driving device comprises two driving members, the driving device also comprises an actuator cooperating with one of the driving members for providing a displacement between the two driving members parallel to the plugging direction of the connectors, one of the driving members is mounted at the housing, while the other is mounted at the insert module, the actuator and one of the driving members are mounted at the housing or at the insert module, respectively, the two driving members of the driving device are a projection extending perpendicularly to the plugging direction of the connectors, and a reception provided for receiving the projection, when the insert module becomes inserted into the respective slot, the actuator comprises a roll rotatably mounted with respect to a rotation axle extending parallel to the plugging direction of the connectors, the displaceable driving member is formed as a screw shaped winding provided at the jacket of the roll and extending coaxially to the rotation axle, and the actuator is adapted for providing a rotation of the roll around its rotation axle.

23. Method for coupling an insert module to a modular device, wherein:

the insert module is inserted into a slot provided by the modular device, by inserting the insert module into the respective slot a module connector provided by the insert module is coupled to a housing connector provided by the modular device within the respective slot, by coupling the connectors the housing connector is connected with the module connector, the insertion of the insert module into the respective slot is driven by a driving device provided by each pair of slot and corresponding insert module, wherein the driving device comprises two driving members and an actuator, one of the driving members is mounted at the housing, while the other is mounted at the insert module, and the two driving members are a projection extending perpendicularly to the plugging direction of the connectors, and a reception, the actuator cooperates with one of the driving members for providing a displacement between the two driving members parallel to the plugging direction of the connectors, and the reception receives the projection, when the insert module becomes inserted into the respective slot.

24. Method for de-coupling an insert module from a modular device, wherein:

the insert module is removed out of a slot provided by the modular device, by removing the insert module out of the respective slot a module connector provided by the insert module is de-coupled from a housing connector provided by the modular device within the respective slot, by de-coupling the connectors the housing connector is disconnected from the module connector, the removing of the insert module out of the respective slot is driven by a driving device provided by each pair of slot and corresponding insert module.

* * * * *

UNITED STATES PATENT AND TRADEMARK OFFICE

CERTIFICATE OF CORRECTION

PATENT NO. : 7,031,169 B2
APPLICATION NO. : 10/442217
DATED : April 18, 2006
INVENTOR(S) : Schlueter et al.

It is certified that error appears in the above-identified patent and that said Letters Patent is hereby corrected as shown below:

In Column 6, line 64, Claim 6, delete “claim 3” and insert -- claim 1 --.

In Column 7, line 1, Claim 7, delete “claim 3,” and insert -- claim 1, --.

In Column 7, line 10, Claim 8, delete “claim 3,” and insert -- claim 1, --.

In Column 7, line 22, Claim 10, delete “claim 3,” and insert -- claim 1, --.

Signed and Sealed this

Sixth Day of February, 2007

JON W. DUDAS
*Director of the United States Patent and Trademark Office*